(12) United States Patent
Blank et al.

(10) Patent No.: US 11,564,310 B2
(45) Date of Patent: Jan. 24, 2023

(54) VIBRATION-DAMPED CIRCUIT ARRANGEMENT, CONVERTER, AND AIRCRAFT HAVING SUCH AN ARRANGEMENT

(71) Applicant: Rolls-Royce Deutschland Ltd & Co KG, Blankenfelde-Mahlow (DE)

(72) Inventors: Rene Blank, Berlin (DE); Martin Franke, Berlin (DE); Peter Frühauf, Falkensee (DE); Matthias Heimann, Potsdam (DE); Nora Jeske, Berlin (DE); Rüdiger Knofe, Teltow (DE); Bernd Müller, Falkenberg (DE); Stefan Nerreter, Heidesee (DE); Jörg Strogies, Berlin (DE); Klaus Wilke, Berlin (DE); Ulrich Wittreich, Velten (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 0 days.

(21) Appl. No.: 17/045,219

(22) PCT Filed: Mar. 20, 2019

(86) PCT No.: PCT/EP2019/056907
§ 371 (c)(1),
(2) Date: Oct. 5, 2020

(87) PCT Pub. No.: WO2019/192843
PCT Pub. Date: Oct. 10, 2019

(65) Prior Publication Data
US 2021/0161002 A1   May 27, 2021

(30) Foreign Application Priority Data
Apr. 5, 2018 (DE) .................... 10 2018 205 141.0

(51) Int. Cl.
*H05K 1/02* (2006.01)
*G11B 33/08* (2006.01)
(Continued)

(52) U.S. Cl.
CPC ........... *H05K 1/0271* (2013.01); *G11B 33/08* (2013.01); *H05K 3/4691* (2013.01); *H05K 1/181* (2013.01);
(Continued)

(58) Field of Classification Search
CPC ............... H05K 1/0271; H05K 3/4691; H05K 2201/0187; H05K 2201/2045;
(Continued)

(56) References Cited

U.S. PATENT DOCUMENTS 3,083,259 A * 3/1963 Wells .................. H05K 7/00
267/141.1
5,453,580 A * 9/1995 Franke ................ H05K 1/0271
174/250
(Continued)

FOREIGN PATENT DOCUMENTS

DE      19914418 A1      10/2000
DE   102011017692 A1    10/2012
EP       2044817 A1      4/2009

OTHER PUBLICATIONS

International Search Report and the Written Opinion for International Patent Application PCT/EP2019/056907 dated Jul. 4, 2019.

*Primary Examiner* — Steven T Sawyer
(74) *Attorney, Agent, or Firm* — Lempia Summerfield Katz LLC

(57) ABSTRACT

The invention relates to a circuit arrangement, comprising at least one wiring carrier plate (1), characterized by at least one separating element (2) formed in the wiring carrier plate (1), which separating element divides the wiring carrier plate
(Continued)

(1) into sections separated by the separating element (2), wherein the transfer of vibrations from one section to another section is at least partially decoupled and/or damped by the separating element (2). The invention further relates to a converter having such a circuit arrangement, and to an aircraft having a converter. The converter can comprise capacitor stacks (3) arranged on the wiring carrier plate (1), and power semiconductors (6).

13 Claims, 3 Drawing Sheets

(51) Int. Cl.
   *H05K 3/46* (2006.01)
   *H05K 1/18* (2006.01)

(52) U.S. Cl.
   CPC ............. *H05K 2201/0187* (2013.01); *H05K 2201/09072* (2013.01); *H05K 2201/10545* (2013.01); *H05K 2201/2045* (2013.01)

(58) Field of Classification Search
   CPC .......... H05K 2201/09036; H05K 2201/09063; G11B 33/08
   See application file for complete search history.

(56) References Cited

U.S. PATENT DOCUMENTS

| | | | | |
|---|---|---|---|---|
| 5,552,209 | A * | 9/1996 | McCutcheon | H05K 1/036 428/209 |
| 6,242,799 | B1 * | 6/2001 | Horiuchi | H01L 23/564 257/700 |
| 6,396,709 | B1 * | 5/2002 | Schmich | H05K 1/028 361/749 |
| 8,212,152 | B2 * | 7/2012 | Togashi | H01G 4/38 174/260 |
| 9,119,299 | B2 * | 8/2015 | Schallmoser | H05K 1/0271 |
| 2004/0084208 | A1 | 5/2004 | Ives | |
| 2008/0003846 | A1 * | 1/2008 | Miyagawa | H05K 1/0231 439/71 |
| 2008/0218984 | A1 | 9/2008 | Togashi | |
| 2009/0151991 | A1 * | 6/2009 | Furutani | H05K 1/0271 174/260 |
| 2014/0055974 | A1 * | 2/2014 | Hansen | H05K 1/14 361/804 |
| 2014/0151797 | A1 * | 6/2014 | Lotfi | H01L 21/8234 257/338 |
| 2017/0025319 | A1 * | 1/2017 | Partington | H01L 23/3675 |
| 2018/0263112 | A1 * | 9/2018 | Kurzeja | B81B 7/0016 |
| 2019/0037685 | A1 * | 1/2019 | Oguri | H05K 1/0271 |
| 2019/0141835 | A1 * | 5/2019 | Furukawa | H03H 7/0115 |
| 2019/0152617 | A1 * | 5/2019 | Anton | H02P 17/00 |
| 2020/0231047 | A1 * | 7/2020 | Demont | H02P 29/028 |

* cited by examiner

VIBRATION-DAMPED CIRCUIT ARRANGEMENT, CONVERTER, AND AIRCRAFT HAVING SUCH AN ARRANGEMENT

This application is the National Stage of International Application No. PCT/EP2019/056907, filed Mar. 20, 2019, which claims the benefit of German Patent Application No. DE 10 2018 205 141.0, filed Apr. 5, 2018. The entire contents of these documents are hereby incorporated herein by reference.

FIELD

The present embodiments relate to a vibration-damped circuit arrangement including at least one wiring carrier board.

BACKGROUND

Electronic structures require ever higher integration densities in order to increase functionality and efficiency. This provides that new approaches to functional integration are also to be provided (e.g., including of power-electronics components, wiring carriers, and cooling elements, as well as elements for information processing and driving the power-electronics components). These requirements necessitate the closest possible local allocation to one another and lead to a variety of challenges with respect to the integration of heterogeneous elements of construction and connection technology.

One major problem is the resulting constructions that have potentially unfavorable properties under mechanical loadings, such as unfavorable behavior when excited by vibrating loads, for example. Extensive elements and elements of which some also have a relatively large mass often have to be stabilized with complex additional structures at present. This causes additional work and therefore costs. This also has an adverse effect on the other product properties, such as the installation space or the system weight, for example.

The problem is currently solved in that restrictions with respect to functional integration are accepted, where design freedom is restricted. Additional constructions for stabilization are accepted. Selective, structurally simple measures, which, however, are often unfavorable in terms of process technology, are taken (e.g., partial gluing/encapsulation with resilient/damping materials such as silicone, polyurethane, etc.).

Structures of this kind are often used in output stages of converters. A power converter that uses an AC voltage or DC voltage to produce an AC voltage, the frequency and amplitude of which are varied, is referred to as a converter (e.g., an inverter). Converters are often configured as AC/DC-DC/AC converters or DC/AC converters, where an output AC voltage is generated from an input AC voltage or an input DC voltage via a DC voltage intermediate circuit and clocked semiconductors.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a solution for a low-vibration circuit arrangement that may also be used in aviation, for example, is provided.

Functional integration of wiring carriers (e.g., wiring carrier boards), which are advantageously used in electronic structures, may be used, in addition to a main function (e.g., electrical wiring), in terms of further integration, to influence the effect with respect to stabilization and favorably change the system properties under mechanical loads.

Vibration-damping separating elements using standard technologies (e.g., printed circuit board production) are used here. The separating elements may be both flexible or semi-flexible and also specially geometrically shaped regions of a wiring carrier board. Further, locally different materials (e.g., reduction in the modulus of elasticity, etc.) may also be used.

The present embodiments include a circuit arrangement including a wiring carrier board and a separating element that is formed in the wiring carrier board. The separating element divides the wiring carrier board into sections that are separated by the separating element. The transmission of vibrations from one section to another section is at least partially decoupled and/or damped by the separating element.

The present embodiments provide the advantage that vibrations from one of the sections of the wiring carrier board are not transmitted or transmitted only in a highly damped manner to another section.

In a development, the separating element may be configured as a locally limited slot or narrowing of the wiring carrier board.

In a further refinement, the separating element may be configured as a locally limited lamination of highly viscoelastic or highly viscous materials into the wiring carrier board.

In a development, the separating element may be formed from a plastic or rubber.

In a further embodiment, the separating element may be configured as a flexible or semi-flexible region of the wiring carrier board.

In a further embodiment, a capacitor stack may be arranged on the wiring carrier board.

The present embodiments also include a converter including a circuit arrangement according to an embodiment. Power semiconductors are arranged on a bottom side of the wiring carrier board.

The present embodiments also include an aircraft including a converter according to an embodiment, and including an electric motor as an electric drive. The electric motor is supplied with electrical power by the converter.

In a development of the aircraft, a propeller may be driven by the electric motor.

BRIEF DESCRIPTION OF THE DRAWINGS

Further special features and advantages of the invention will become clear from the following explanations of exemplary embodiments with reference to schematic drawings, in which.

DETAILED DESCRIPTION

Figure 1:
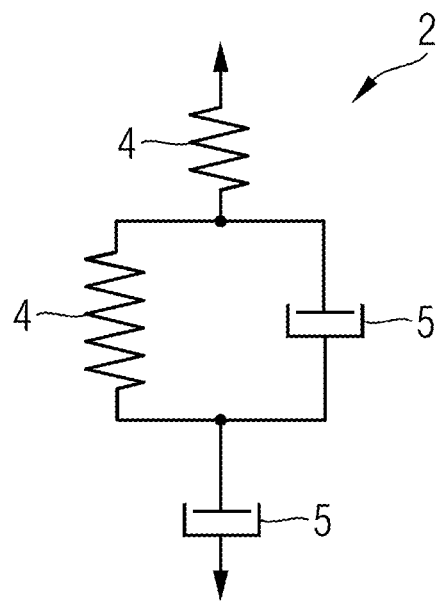
FIG. 1 shows one embodiment of an equivalent circuit diagram of a vibration-damping element.

FIG. 1 shows a mechanical four-parameter model equivalent circuit diagram of a separating element 2 of a wiring carrier board 1, not illustrated. The model describes elastic and irreversibly viscous dimensional changes to materials of the separating element 2.

The four-parameter model is also referred to as a "Burger model". In this model, a Kevin-Voigt model, in which a spring element 4 and a damper element 5 are connected in parallel, are connected in series with a Maxwell model, in which a spring element 4 and a damper element 5 are connected in series.

Figure 2:
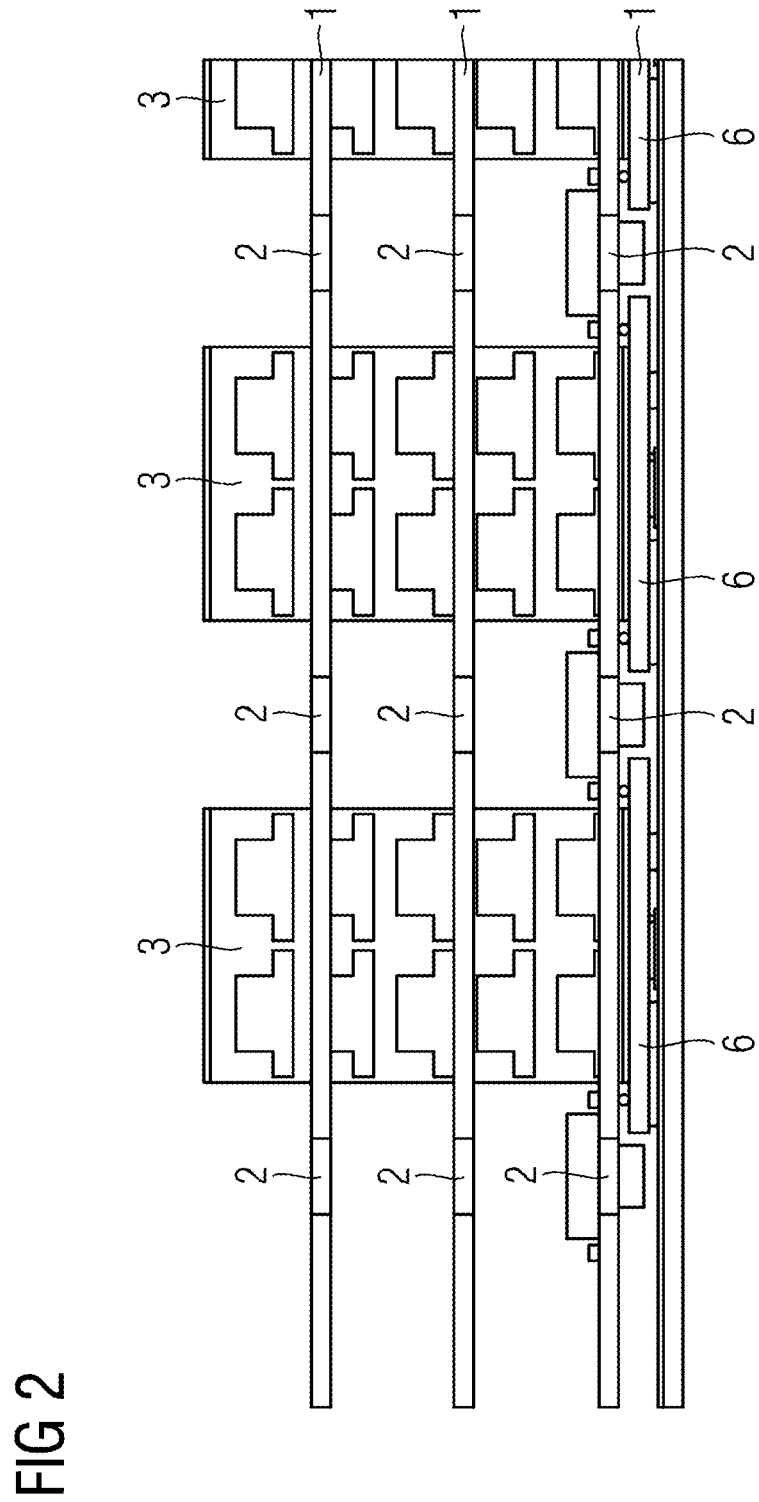
FIG. 2 shows one embodiment of a circuit arrangement including vibration-damping elements.

FIG. 2 shows a circuit arrangement of an output stage 9 having a plurality of wiring carrier boards 1 on which capacitor stacks 3 are arranged. Power semiconductors 6 are located on a bottom side of a wiring carrier board 1. According to the present embodiments, the wiring carrier board 1 is divided into vibration-decoupled sections by separating elements 2 that are formed in the wiring carrier board 1 (e.g., in accordance with FIG. 1). As a result, vibrations of one section are not transmitted or are transmitted only in a damped manner to other sections of the wiring carrier board 1.

The separating element 2 may be configured, for example, as a locally limited slot or narrowing of the wiring carrier board 1. Alternatively, the separating element 2 is configured as a locally limited lamination of highly viscoelastic or highly viscous materials into the wiring carrier board 1. In this case, the separating element 2 may be a plastic or composed of rubber. In this case, the separating element 2 is configured as a flexible or semi-flexible region (e.g., composed of a rubber-like material) of the wiring carrier board 1.

Figure 3:
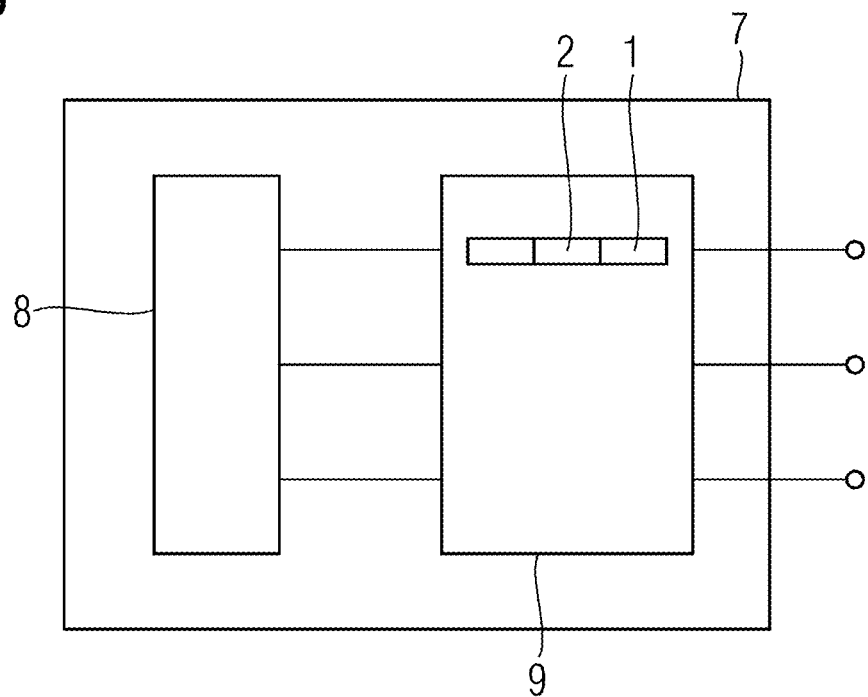
FIG. 3 shows a block diagram of one embodiment of a converter.

FIG. 3 shows a highly simplified block diagram of a converter 7 including an intermediate circuit 8 and an output stage 9 that has a circuit arrangement according to FIG. 2, including at least one wiring carrier board 1 and separating elements 2 that are formed in the wiring carrier board 1.

Figure 4:
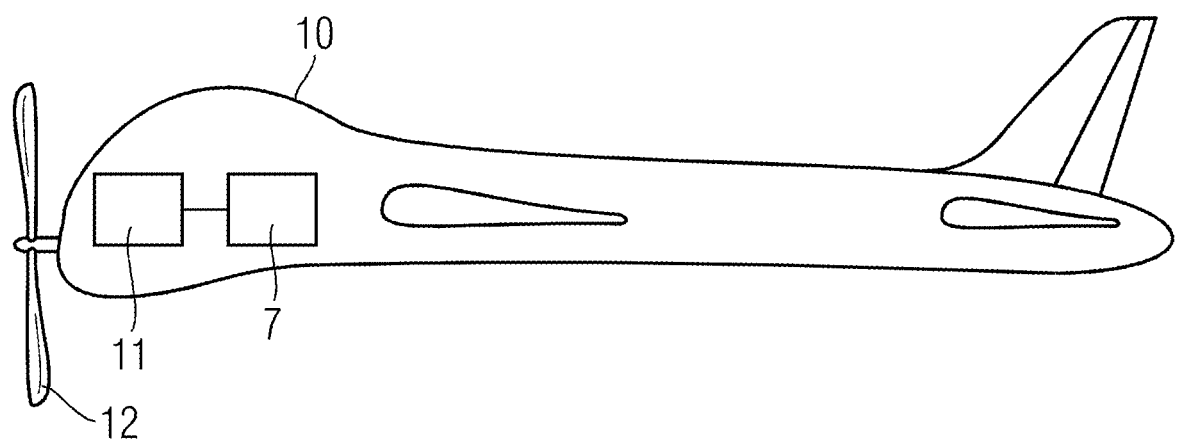
FIG. 4 shows one embodiment of an aircraft including an electric drive.

FIG. 4 shows an electrically driven aircraft 10, in which an electric motor 11 sets a propeller 12 in motion. The electric motor 11 is supplied with electrical power by a converter 7 according to the block diagram of FIG. 3.

Although the present embodiments have been described and illustrated more specifically in detail by the exemplary embodiments, the invention is not restricted by the disclosed examples, and other variations may be derived therefrom by a person skilled in the art without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A circuit arrangement comprising:
    at least one wiring carrier board;
    at least two separating elements that are formed in a wiring carrier board of the at least one wiring carrier board, wherein the at least two separating elements divide the wiring carrier board into sections that are separated by the at least two separating elements;
    one or more capacitor stacks that are arranged on the wiring carrier board, in at least one of the sections of the wiring carrier board separated by the at least two separating elements, respectively, wherein a capacitor stack of the one or more capacitor stacks is arranged on a first side of the wiring carrier board, in a section of the at least one section of the wiring carrier board; and
    a power semiconductor that is arranged on a second side of the wiring carrier board, in the section of the wiring carrier board, the second side of the wiring carrier board being opposite the first side of the wiring carrier board,
    wherein transmission of vibrations from one of the sections to another of the sections is at least partially decoupled, damped, or decoupled and damped by the at least two separating elements, and
    wherein the at least two separating elements are configured as locally limited laminations of viscoelastic or viscous materials into the wiring carrier board.

2. The circuit arrangement of claim 1, further comprising another separating element, the other separating element being configured as a locally limited slot or a narrowing of the at least one wiring carrier board.

3. The circuit arrangement of claim 1, wherein a separating element of the at least two separating elements is formed from a rubber-like material.

4. The circuit arrangement of claim 1, wherein the at least two separating elements are configured as flexible or semi-flexible regions of the wiring carrier board.

5. A converter comprising:
    a circuit arrangement comprising:
        at least one wiring carrier board;
        at least two separating elements that are formed in a wiring carrier board of the at least one wiring carrier board, wherein the at least two separating elements divide the wiring carrier board into sections that are separated by the at least two separating elements, and wherein transmission of vibrations from one of the sections to another of the sections is at least partially decoupled, damped, or decoupled and damped by the at least two separating elements; and
        one or more capacitor stacks that are arranged on the wiring carrier board, in at least one of the sections of the wiring carrier board separated by the at least two separating elements, respectively, wherein a capacitor stack of the one or more capacitor stacks is arranged on a first side of the wiring carrier board, in a section of the at least one section of the wiring carrier board; and
    power semiconductors that are arranged on a second side of the wiring carrier board, at least one of the power semiconductors being positioned in the section of the wiring carrier board, the second side of the wiring carrier board being opposite the first side of the wiring carrier board, wherein the at least two separating elements are configured as locally limited laminations of viscoelastic or viscous materials into the wiring carrier board.

6. An aircraft comprising:
a converter comprising:
  a circuit arrangement comprising:
    at least one wiring carrier board;
    at least two separating elements that are formed in a wiring carrier board of the at least one wiring carrier board, wherein the at least two separating elements divide the wiring carrier board into sections that are separated by the at least two separating elements, and wherein transmission of vibrations from one of the sections to another of the sections is at least partially decoupled, damped, or decoupled and damped by the at least two separating elements; and
    one or more capacitor stacks that are arranged on the wiring carrier board, in at least one of the sections of the wiring carrier board separated by the at least two separating elements, respectively, wherein a capacitor stack of the one or more capacitor stacks is arranged on a first side of the wiring carrier board, in a section of the at least one section of the wiring carrier board; and
  power semiconductors that are arranged on a second side of the at least one wiring carrier board, at least one of the power semiconductors being positioned in the section of the wiring carrier board, the second side of the wiring carrier board being opposite the first side of the wiring carrier board; and
an electric motor as an electric drive of the aircraft,
wherein the electric motor is supplied with electrical power by the converter, and
wherein the at least two separating elements are configured as locally limited laminations of viscoelastic or viscous materials into the wiring carrier board.

7. The aircraft of claim 6, further comprising a propeller that is driven by the electric motor.

8. The aircraft of claim 6, further comprising another separating element, the other separating element being configured as a locally limited slot or a narrowing of the at least one wiring carrier board.

9. The aircraft of claim 6, wherein a separating element of the at least two separating elements is formed from a rubber-like material.

10. The aircraft of claim 6, wherein the at least two separating elements are configured as flexible or semi-flexible regions of the wiring carrier board.

11. The converter of claim 5, further comprising another separating element, the other separating element being configured as a locally limited slot or a narrowing of the at least one wiring carrier board.

12. The converter of claim 5, wherein a separating element of the at least two separating elements is formed from a rubber-like material.

13. The converter of claim 5, wherein the at least two separating elements are configured as flexible or semi-flexible regions of the wiring carrier board.

* * * * *